United States Patent
Toyama (10) Patent No.: US 7,117,140 B2
(45) Date of Patent: Oct. 3, 2006

(54) METHOD OF EVALUATING THE EXPOSURE PROPERTY OF DATA TO WAFER

(75) Inventor: Nobuhito Toyama, Tokyo (JP)

(73) Assignee: Dainippon Printing Co., Ltd., Tokyo (JP)

(*) Notice: Subject to any disclaimer, the term of this patent is extended or adjusted under 35 U.S.C. 154(b) by 969 days.

(21) Appl. No.: 10/128,142

(22) Filed: Apr. 23, 2002

(65) Prior Publication Data

US 2002/0194576 A1   Dec. 19, 2002

(30) Foreign Application Priority Data

Apr. 26, 2001   (JP)   ............... 2001-130264

(51) Int. Cl.
    G06F 17/50   (2006.01)
    G06F 7/62    (2006.01)

(52) U.S. Cl. .............. 703/14; 703/13; 716/3; 716/19; 716/21; 430/5

(58) Field of Classification Search ............ 703/6, 703/13–14; 438/5–18; 716/19–21; 430/5
    See application file for complete search history.

(56) References Cited

OTHER PUBLICATIONS

Schellenberg, Frank M. "Resolution Enhancement with OPC/PSM." Jan. 7, 2000, Future Fab Intl. vol. 9.*
Cobb, Nicholas Bailey. "Fast Optical and Process Proximity Correction Algorithms for Integrated Circuit Manufacturing." Doctorate Dissertation, University of California at Berkeley. 1998. pp. 72-86.*
Erdelyi, Miklos et al. "Enhanced Optical Microlithography with a Fabry-Perot Based Spatial Filtering Technique." Mar. 1, 2000. Applied Optics, vol. 39 No. 7.*

* cited by examiner

*Primary Examiner*—Kamini Shah
*Assistant Examiner*—Kimberly A. Thornewell
(74) *Attorney, Agent, or Firm*—Flynn, Thiel, Boutell & Tanis, P.C.

(57) ABSTRACT

A method of evaluating the exposure property of data to a wafer in which errors in the production of a photomask and the formation of patterns caused by defocus in the transfer of data to the wafer are considered. Accordingly, errors in the production of the photomask and deformation of patterns caused by defocus can be evaluated in the stage of design data. Oversize processing and undersize processing are given to pattern data of the object of the process by figure operation for the whole pattern data within errors of the production of the photomask according to the specification thereof, and simulation is used as a reference to the original pattern data of the object of the process, the oversize data in which oversize processing is given to the pattern data and the undersize data in which undersize processing is given to the pattern data, in which the wafer exposure simulation is carried out under the condition of zero focus, or under each exposure condition of zero focus, a given value minus defocus or a given value plus defocus. The exposure property of data to the wafer is evaluated from the results of the wafer exposure simulation.

4 Claims, 9 Drawing Sheets

| PATTERN ID | DIMENSIONS OF PATTERNS OF DATA PATTERN D0 [nm] | DIMENSIONS OF PATTERNS OF MASK M0 [nm] | DIMENSIONS OF PATTERNS OF WAFER | | |
|---|---|---|---|---|---|
| | | | ZERO DEFOCUS W0 [nm] | +DEFOCUS W1 [nm] | −DEFOCUS W2 [nm] |
| 1101 | 130 | 130 | 135 | 129 | 131 |
| 1102 | 130 | 134 | 141 | 136 | 138 |
| 1103 | 180 | 180 | 199 | 199 | 204 |
| 1104 | 180 | 184 | 204 | 203 | 209 |
| ⋮ | ⋮ | ⋮ | ⋮ | ⋮ | ⋮ |

| ID | DIMENSIONS OF PATTERNS OF DATA PATTERN [nm] | DIMENSIONS OF PATTERNS OF MASK [nm] | DIMENSIONS OF PATTERNS OF WAFER [nm] |
|---|---|---|---|
| 1101 | 120 | 122 | 110 |
| 1102 | 120 | 123 | 112 |
| 1103 | 180 | 182 | 175 |
| 1104 | 180 | 183 | 178 |

METHOD OF EVALUATING THE EXPOSURE PROPERTY OF DATA TO WAFER

FIELD OF THE INVENTION

The present invention relates to the proving and the evaluation technique of the exposure property of design data to a wafer in the production of a semiconductor device, and particularly to the proving and evaluating technique of the exposure property of design data to a wafer by means of the technique of the wafer exposure simulation in the process of miniaturization of a semiconductor.

BACKGROUND OF THE INVENTION

In recent years, progress in high density circuits and the miniaturization of semiconductor devices has been made in the production of semiconductor device. A photomask (it is also called a "reticle") is used and figures having a length shorter than exposure wavelength of an aligner used in the production of a semiconductor have been written on a wafer by the exposure of the wafer since the latter half of 1990's.

Figure 3:
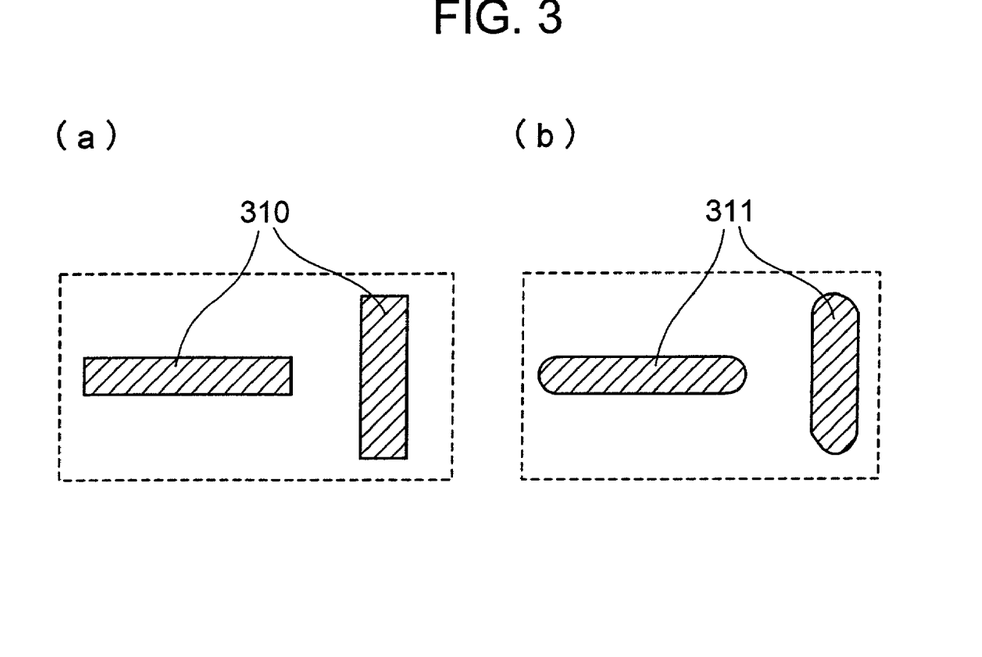
FIG. 3 is an explanatory drawing showing the pattern data used and results of the wafer exposure simulation.

In this case, a difference between a pattern formed on a photomask and a pattern formed on a semiconductor wafer is generated by the diffraction phenomena of light. For example, patterns of design data shown in FIG. 3(a) become patterns on a wafer as shown in FIG. 3(b).

Namely, the pattern formed on a semiconductor wafer is different from the design data by the diffraction phenomena of light and so distorted.

This is called generally the optical proximity effect.

In order to change the pattern formed on a semiconductor wafer into an objective shape considering the distortion of a pattern formed on a wafer by the optical proximity effect, a photomask having a corrected pattern different from the design data is produced by adding corrections to the design data so as to change the shapes of patterns on a photomask into shapes different from the design data. The technique of forming the pattern adapted to objective design data on a wafer using the photomask having corrected patterns is called optical proximity correction (OPC).

Figure 9:
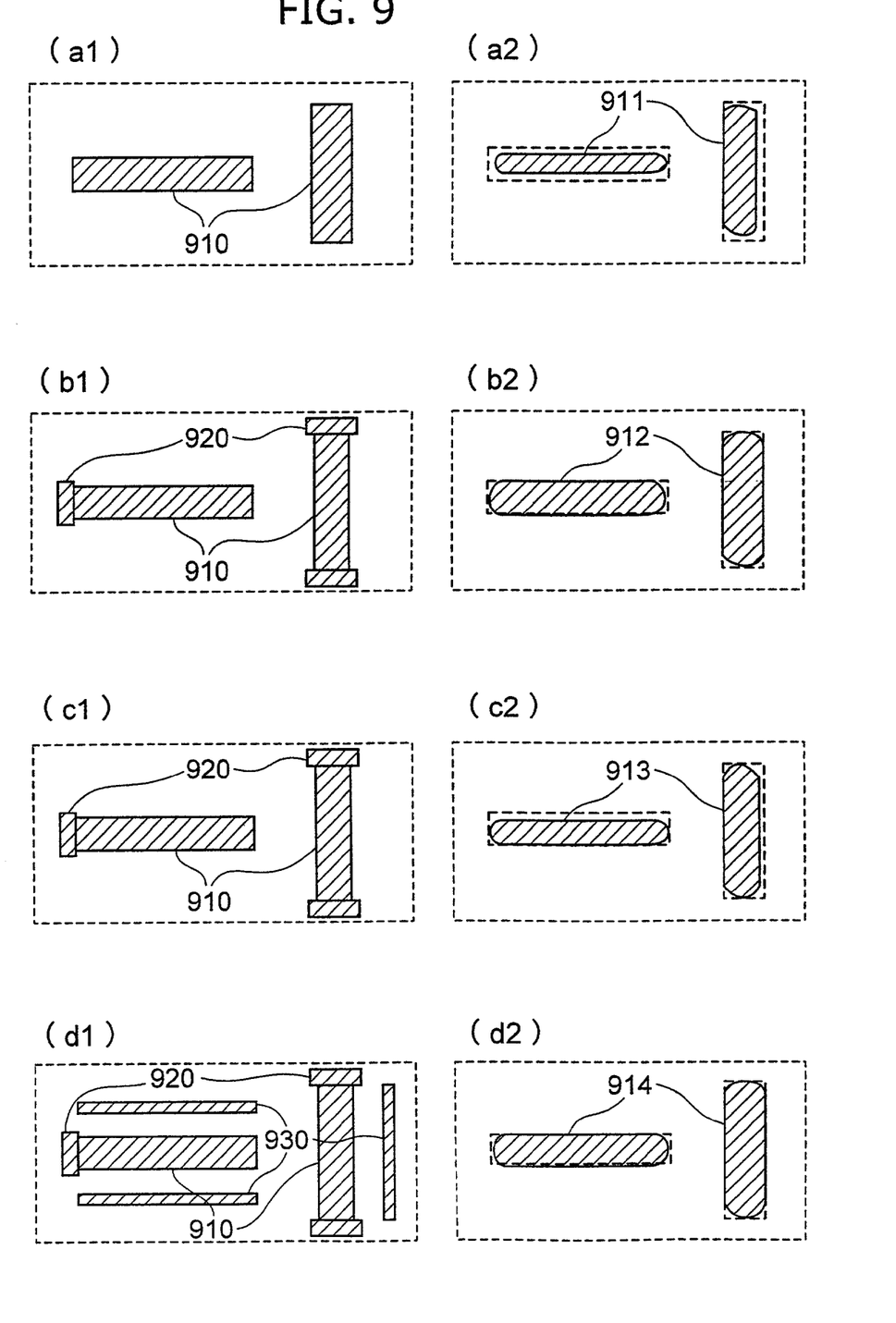
FIG. 9 is an explanatory drawing of OPC.

An example of the application of the technique of optical proximity correction is shown in FIG. 9.

FIG. 9, FIG. 9(a2), FIG. 9(b2), FIG. 9(c2) and FIG. 9(d2) show the shapes of patterns in the case of patterns being formed on a wafer using pattern data shown in FIG. 9(a1), FIG. 9(b1), FIG. 9(c1) and FIG. 9(d1), respectively.

Pattern data shown in FIG. 9(a1) are design data, wherein patterns formed on a wafer corresponding to patterns 910 form patterns having either a thin width or short length because of the optical proximity effect.

FIG. 9(b1) shows data in which OPC is applied to design data (FIG. 9(a1)).

In this case, numeral 920 designates OPC patterns, wherein it is assumed that there is no defocus in the wafer exposure or the exposure of data to the wafer.

As a result, patterns formed on wafer corresponding to patterns 910 form patterns 912 shown in FIG. 9(b2) so that patterns 912 approach the shape of patterns of the objective design data as compared with patterns shown in FIG. 9(a2).

FIG. 9(c1) shows patterns of data in which OPC 920 is applied to design data 910 in the same manner as shown in FIG. 9(b1). However, when there is defocus in the wafer exposure, patterns formed on a wafer are deformed, for example, into patterns shown in FIG. 9(c2).

In the wafer exposure, considering the flatness of the wafer and the thickness of the resist, there can be a defocus of about 300 nm ordinarily.

Accordingly, an OPC technique in which supplementary patterns for increasing the defocus latitude is applied to design data is also applied as a part of the OPC technique for the purpose of the correction of shapes.

For example, as shown in FIG. 9(d1), OPC patterns 920 and supplementary patterns 930 (also called assist bars or merely OPC patterns) for increasing the defocus latitude are applied to design data 910 so that the defocus latitude can be increased.

In this case, even if there is a defocus, patterns formed on a wafer come into shapes approaching patterns of the design patterns (patterns 910 shown in FIG. 9(a1)) in the same manner as in the case of the defocus shown in FIG. 9(b2).

Namely, according to the use of OPC pattern 930 for the improvement of defocus latitude shown in FIG. 9(d1), patterns 914 formed on a wafer have the shape as shown in FIG. 9(d2), even if there is a defocus in the exposure of data to the wafer so that the deformation of the pattern caused by the diffraction of light is corrected as compared with the case shown in FIG. 9(c2). As a result, the defocus latitude is improved.

Accordingly, the improvement of the yield of products in the production of a semiconductor can be expected.

As mentioned hereinbefore, a difference between patterns in design data and shapes of patterns formed on a wafer is generated by the optical proximity effect in the process of the miniaturization of semiconductors. Therefore, in recent years, the wafer exposure simulation is employed as the effective means for the evaluation of design data, namely the evaluation of data to which OPC has been applied.

Figure 10:
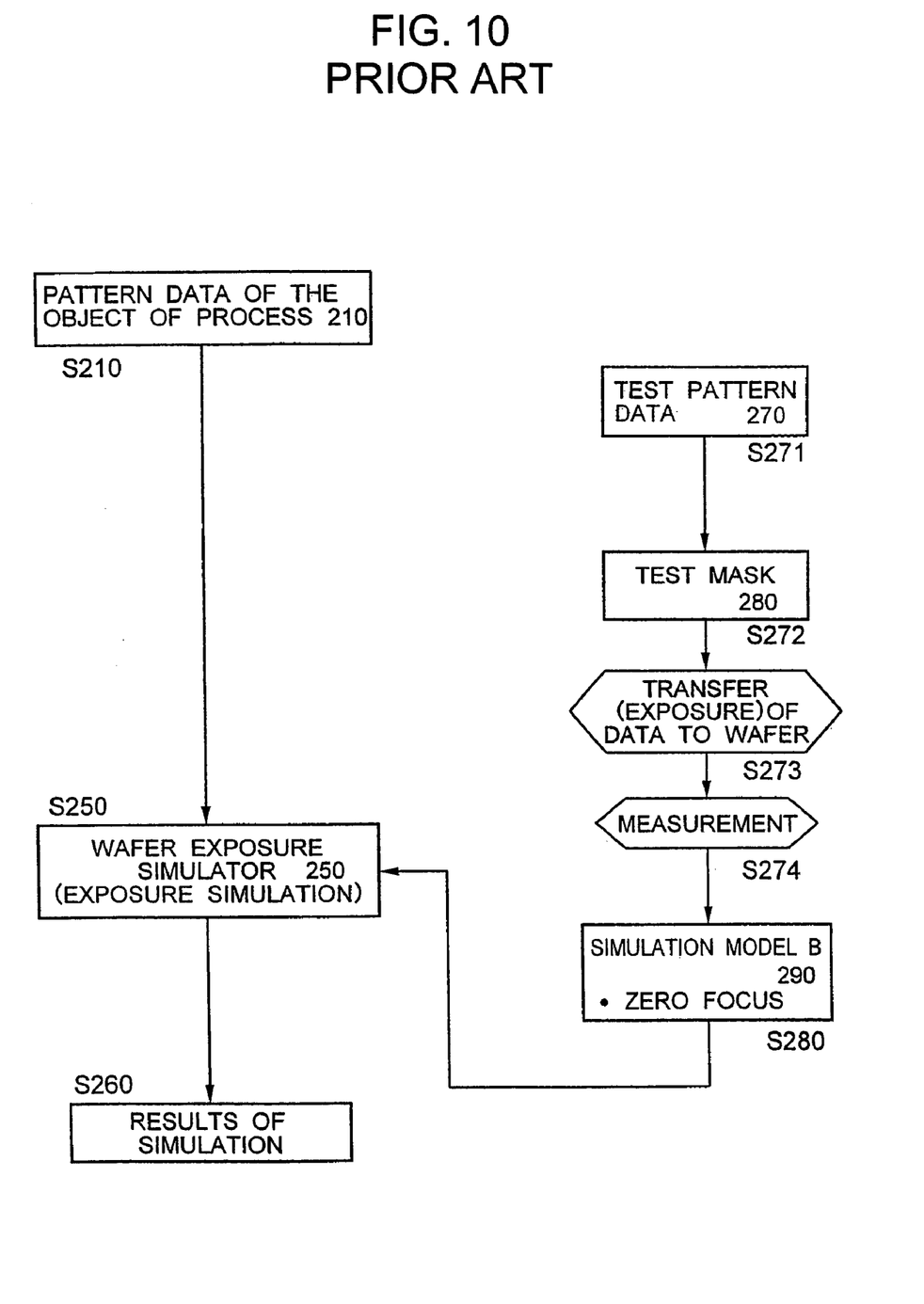
FIG. 10 is a flow diagram of a conventional method of evaluating the exposure property of data to a wafer.

Referring to FIG. 10, a conventional method of evaluating pattern data by the wafer exposure simulation is explained.

In FIG. 10, S210 to S260 designate steps of the process.

First, the wafer exposure simulation is mentioned.

Figure 11:
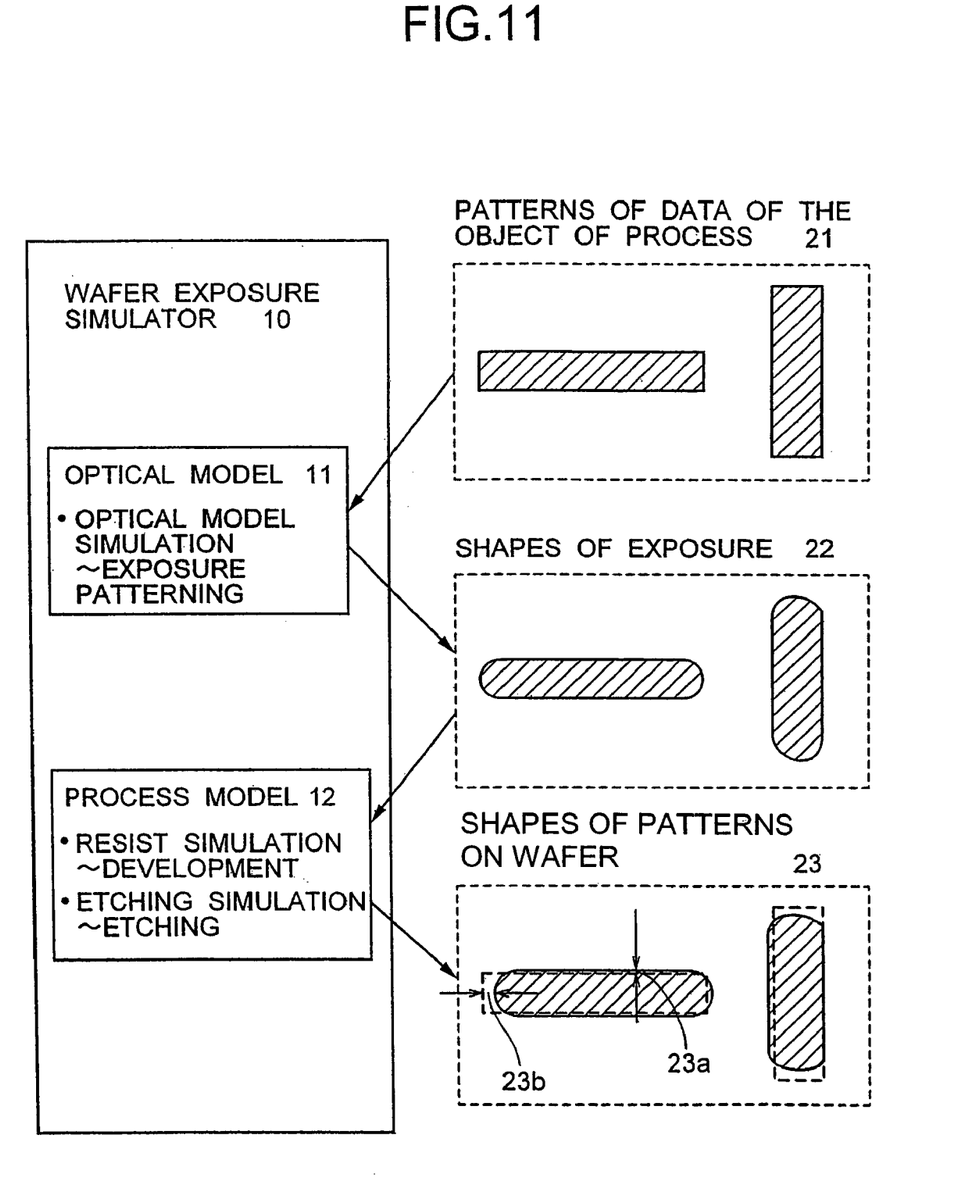
FIG. 11 is an explanatory drawing of the wafer exposure simulator.

The wafer exposure simulation is done by means of device 10 provided with software for simulating shapes of patterns formed on a wafer on the basis of patterns 21 of design data as shown in FIG. 11 (the device is called a wafer exposure simulator), wherein the wafer exposure simulator is usually provided with a display and input and output terminals.

The wafer exposure simulation is ordinarily comprised of two steps of optical simulation (it is also called an optical model simulation) and resist-simulation (the resist-simulation is also called a development simulation, and one of the process model simulations). Further, there is also a case where the wafer exposure simulation is comprised of three steps of optical model simulation, resist-simulation and etching process simulation (the etching process is one of the process model simulations).

In the optical simulation, there is a condition of image formation which is determined exclusively by the wavelength of the source and number of apertures of the source (NA), and σ (σ indicates coherency and is also designated by "sigma"). Aberration and vibration of the aligner are considered selectively for optical simulation in the optical simulation.

In the resist-simulation, simulation of the development process (resist process) is carried out on the basis of the result determined exclusively by optical simulation. However, since the number of parameters is too many, calibrating test patterns and process models obtained by writing test patterns on a wafer by the exposure of data to a wafer into measuring the length of the written patterns in a simulation model is employed.

Simulation of an etching process can be carried out in the same manner as in a simulation of a development process (resist process). Therefore, the simulation of an etching process can be omitted under certain circumstances.

First, test mask 280 is formed on the basis of test pattern data 270 (S271) at S272. Then, simulation model B (designated by numeral 290 at S280) is formed through the transfer of pattern data to a wafer or the exposure of pattern data to a wafer through test mask 280 (S273) and measurement (S274) of the length of the written pattern on a wafer by the wafer exposure.

Zero defocus is ordinarily assumed for a wafer.

The wafer exposure simulation is carried out using the formed simulation model B (290) and data with OPC in which OPC is applied to design data designed for the circuit of a semiconductor device as pattern data 210 of the object of process 210, by means of the wafer exposure simulator 250, so that the shapes of patterns formed on a wafer are evaluated and proved.

Simulation model B (290 at S280) is used as a reference to pattern data 210 of the object of the process. The wafer exposure simulation is carried out at a given defocus (usually zero defocus), by which shapes of patterns formed on a wafer are evaluated.

In this case, simulation model B 290 is comprised of a group of dimension data obtained by writing patterns on a wafer by the exposure of data to the wafer through test mask 280 which is a photomask for tests produced on the basis of test pattern data 270 under the condition of the wafer exposure with a given defocus (usually zero defocus), measuring the dimensions of given transferred patterns to a wafer and relating dimension data of test pattern data 270, dimension data of test mask 280 and dimension data of patterns on the wafer at the correspondent positions with each other for the respective conditions of the wafer exposure.

Contents to be evaluated here are the evaluations of the shapes of patterns formed on a wafer. Differentials 23a, 23b between patterns 21 of data to be processed and the shapes of patterns 23 formed on a wafer on the effect of simulation are measured, as shown in block 23 of FIG. 11. In case of the differentials being larger than a prescribed value, correction is made in the step of design.

The exposure property of data to the wafer evaluated made according to conventional simulation is made using ideal design patterns and assuming that there is no error in the production of a photomask and that ideal zero defocus is set for the wafer exposure.

Therefore, errors in the production of the photomask and deformation of patterns caused by defocus in the wafer exposure could not be evaluated from the wafer exposure simulation.

Conventional methods of the evaluation of the exposure property of data to a wafer are satisfactory when the dimensions of the patterns formed on a wafer are more than about ⅔ of the exposure wavelength. However, when miniaturization progresses further, errors in the production of the photomask and deformation of the patterns caused by defocus become serious.

With high density circuits and the miniaturization of semiconductor devices progressing in recent years, in the evaluation of the exposure property of data to a wafer with conventional simulations, there was a problem that errors in the production of a photomask and deformation of patterns caused by a defocus in the exposure of data to wafer cannot be evaluated by the wafer exposure simulation because ideal design patterns are used assuming that the produced photomask has no error in the production of the photomask and that ideal zero defocus is set in the condition of the wafer exposure.

Corresponding to the above-mentioned problem, it is an object of the present invention to provide a method of evaluating the exposure property of data to a wafer in which errors in the production of a photomask and deformation of patterns caused by a defocus in the exposure of data to a wafer are considered.

Accordingly, the present invention aims at evaluating errors in the production of a photomask and the deformation of patterns cased by a defocus in the exposure of data to a wafer in the stage of design data.

SUMMARY OF THE INVENTION

A method of evaluating the exposure property of data to a wafer of the present invention is a method in which pattern data for the production of a photomask such as design data designed for the circuit of a semiconductor device and data in which OPC is applied to design data are used as pattern data of the object of the process and the exposure property of data to a wafer in the case of the production of a photomask of the object of the process is evaluated in the stage of data, without producing a photomask from the pattern data of the object of the process, wherein the method comprises the steps: giving oversize processing and undersize processing to pattern data of the object of the process by the figure operation for all pattern data within a range of errors of the production in the specification of the production of a photomask; carrying out the wafer exposure simulation using a simulation model provided in advance as a reference to the original pattern data of the object of the process, oversize data in which oversize processing is given to the pattern data and undersize data in which undersize processing is given to the pattern data under conditions of the wafer exposure of zero defocus or under the respective conditions of the wafer exposure of zero defocus, a given value minus defocus and a given value plus defocus and evaluating the exposure property of data to the wafer from the results of the wafer exposure simulation, and wherein the simulation model is comprised of a group of dimension data obtained by using a test mask which is a photomask for a test produced on the basis of test pattern data, carrying out the exposure of data to a wafer under the conditions of zero defocus, or under the respective conditions of zero defocus, a given value minus defocus and a given value plus defocus, measuring the dimensions of the patterns transferred to a wafer and relating dimension data of test pattern data, dimension data of patterns on a photomask and dimension data of patterns on the wafer at the correspondent positions with each other for the respective conditions of the wafer exposure.

Further, a method of evaluating the exposure property of data to a wafer of the present invention is a method in which the pattern data for the production of a photomask, such as design data designed for the circuit of a semiconductor device and data in which OPC is applied to design data, are used as pattern data of the object of a process and the exposure property of data to a wafer for the production of a photomask of the object of the process is evaluated in the stage of data, without producing a photomask from the pattern data of the object of the process, wherein the method comprises the steps of: carrying out the exposure of data to a wafer using a simulation model provided in advance as a reference to the pattern data of the object of a process under the respective conditions of zero defocus, a given value minus defocus and a given value plus defocus and evaluating the exposure property of data to the wafer from the results of the wafer, and wherein the simulation model is comprised of a group of dimension data obtained by using a test mask of a photomask for a test produced on the basis of test pattern data, carrying out the exposure of data to a wafer under the respective conditions of the wafer exposure of zero defocus, a given value minus defocus and a given value plus defocus, measuring the dimensions of the patterns transferred to the wafer and relating the dimension data of test pattern data, dimension data of the patterns on a photomask and dimension data of the patterns on the wafer at the corresponding portions with each other for the respective conditions of the wafer exposure.

In the above-mentioned method of evaluating the exposure property of data to a wafer, the pattern data of the object of the process are characterized by pattern data in which OPC is applied to design data.

In this case, design data are data after a layout design designed for a circuit of semiconductor device has been completed.

Accordingly, a method of evaluating the exposure property of data to a wafer of the present invention enables the provision of a method of evaluating the exposure property of data to a wafer in which errors in the production of a photomask and the deformation of patterns caused by a defocus in the exposure of data to the wafer are considered.

Accordingly, evaluating the errors of the production of a photomask and the deformation caused by a defocus in the exposure data to a wafer are considered to be made possible.

Particularly, oversize processing and undersize processing are given to the pattern data of the object of the process by figure operation for the whole pattern data within errors of the production of a photomask in the specification of the production of the photomask, and the wafer exposure simulation is carried out using the simulation model as a reference to the original pattern data of the object of the process, the oversize data in which oversize processing is given to the pattern data and the undersize data in which undersize processing is given to the pattern data under the condition of a desired wafer exposure condition so that the exposure property of data to the wafer can be evaluated. Accordingly, the degree of deformation caused by errors of the production of the photomask can be proved by which the evaluation of the exposure property of data to the wafer based on the specification of the production of the photomask is made possible.

Further, the specification of the production of a photomask can be set suitably.

Further, a simulation model is obtained by carrying the exposure of data to a wafer through the test mask produced on the basis of test pattern data under the respective conditions of the exposure of data to a wafer under a zero defocus, a given minus defocus and a given plus defocus, measuring the dimensions of the given patterns transferred to the wafer and relating the dimension data of the test pattern data, dimension data of patterns on photomask and dimension data of patterns on a wafer at the corresponding portions with each other for the respective conditions of the wafer exposure to obtain a group of dimension data. The wafer exposure simulation is carried out using the simulation model comprised of the group of dimension data as a reference under the respective conditions of the wafer exposure of zero focus, a given minus defocus and a given plus defocus by which the exposure property of data to the wafer is evaluated. Accordingly, a defocus latitude in the process of the production of a wafer can be proved.

Namely, the degree of deformation caused by errors in the production of the photomask and the defocus latitude can be proved so that feed-back of the degree of deformation caused by errors of the production of the photomask and the defocus latitude to design is made possible from the viewpoint of accuracy of the production or the load of the production of the photomask or the yield of the wafer prior to the production of the photomask.

Further, the pattern data of the object of the process is effective in the case of OPC being applied to the design data.

PREFERRED EMBODIMENT OF THE INVENTION

Referring to the drawings, an example of a mode for carrying out the invention is explained.

Figure 1:
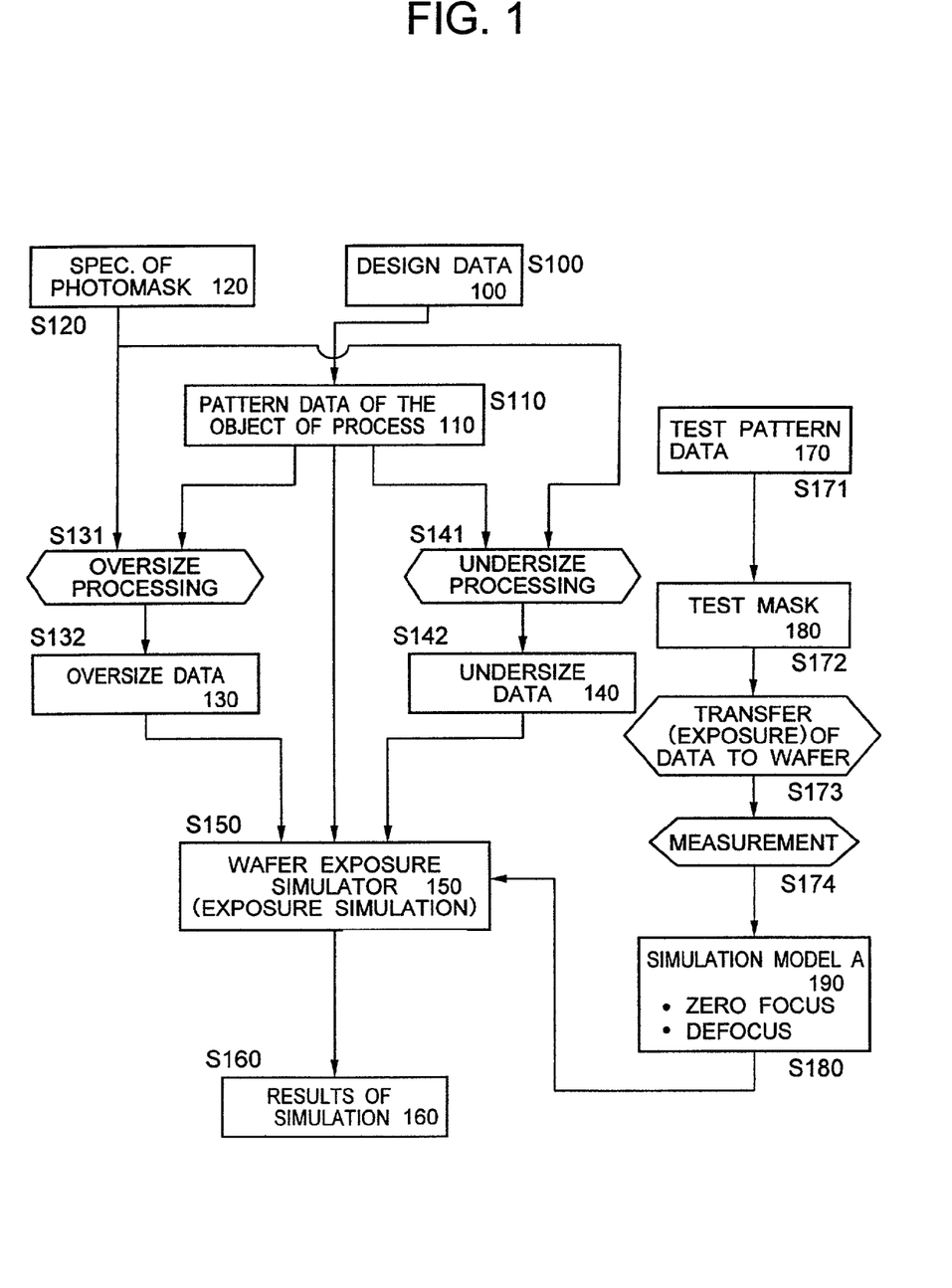
FIG. 1 is a flow diagram showing one example of mode of a method of evaluating the exposure property of data to a wafer of the present invention.
Figure 2:
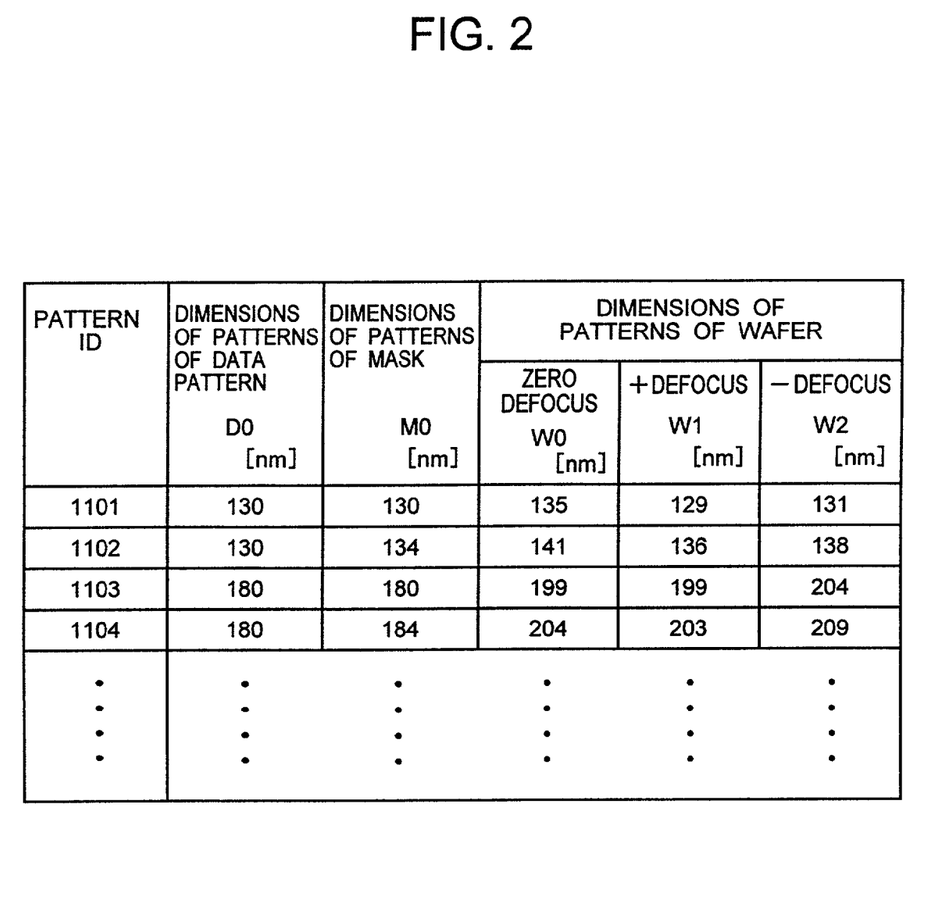
FIG. 2 is a table for illustrating a simulation model.

FIG. 1 is a flow diagram showing one example of a mode of a method of evaluating the exposure property of data to a wafer of the present invention. FIG. 2 is a table for illustrating a simulation model.

In FIG. 1, numeral 100 designates design data; numeral 110 designates pattern data of the object of the process; numeral 120 designates the specification of a photomask; numeral 130 designates oversize data; numeral 140 designates undersize data; numeral 150 designates the wafer exposure simulator; numeral 160 designates results of the simulation; numeral 170 designates test pattern data; numeral 180 designates a test mask and numeral 190 designates simulation model A.

In FIG. 1, S100 to S180 show steps of the process.

Referring to FIG. 1, a mode for carrying out a method of evaluating the exposure property of data to a wafer of the present invention is explained.

This example is a method of evaluating the exposure property of data to a wafer in which the pattern data for the production of a photomask such as design data 100 designed for a circuit of a semiconductor device and data in which OPC is applied to design data 100 is used as pattern data 110 of the object of the process and the exposure property of data to the wafer is evaluated when a photomask of the object of process is produced in the stage of data without producing a photomask from pattern data 110 of the object of the process, wherein oversize processing and undersize processing are given to the whole of the pattern data 110 of the object of the process within a range of errors in the specification of the production of a photomask by figure operation. The wafer exposure simulation is carried out using simulation model A 190 provided in advance as a reference to original data 110 of the object of the process, oversize data 130 in which oversize processing is given to the pattern data and undersize data 140 in which undersize processing is given to the pattern data under the respective conditions of the exposure of a wafer to zero defocus, a given value minus defocus and a given value plus defocus and the exposure property of data to a wafer is evaluated from the results of the wafer exposure simulation.

The simulation model A 190 used here is comprised of a group of dimension data obtained by carrying out the exposure of data to a wafer through test mask 180 which is a photomask for a test produced on the basis of test pattern data 170 under the respective conditions of the wafer exposure with zero focus, a given value minus defocus and a given value plus defocus, measuring the dimensions of given transferred patterns to the wafer and relating the dimension data of the patterns of test pattern data, dimension data of patterns on the photomask and dimension data of patterns on the wafer at the corresponding positions with each other for the respective conditions of the exposure of data to the wafer.

First, pattern data 110 of the object of the process is provided (S110).

Design data 100 designed for a circuit of a semiconductor device, data in which OPC is applied to design data 100 and pattern data in which some processing is given to the design data 100 can be used as pattern data 110 for the object of the process. However, in this case, the pattern data for the object of the process is assumed to be the pattern data in which OPC is applied to design data 100 (S100) to explain it simply.

Then, oversize processing and undersize processing are given to the whole of pattern data 110 for the object of the process within a range of errors in the specification of the production of a photomask by figure operation (S131, S141), by which original pattern data 110 for the object of process, oversize data 130 in which oversize processing is given to the pattern data (S132) and undersize data 140 in which undersize processing is given to the pattern data (S142) are obtained.

On the other side, test mask 180 for test (S172) is produced on the basis of test pattern data 170 (S171). The exposure of data to a wafer (S173) is carried out under the respective conditions of a wafer exposure of zero defocus, a given value minus defocus and a given value plus defocus. Further, dimension data of patterns of given transferred patterns are measured (S174) and dimension data of patterns of test pattern data, patterns on a photomask and patterns on a wafer at the corresponding positions are related with each other for the respective conditions of the wafer exposure so that a group of dimension data is provided as simulation model A190 (S180).

For example, in the exposure of data to wafer (S173), light is applied to the wafer with keeping conditions of the exposure to the wafer under the conditions of zero defocus as well as +300 nm defocus and −300 nm defocus. Results of the measurement of the dimensions of the patterns are obtained as + defocus data and − defocus data.

In this case, conditions for carrying out some general wafer exposure simulation (for example, by means of Calibre ORC manufactured by Mentor Graphics Corporation) is set.

Test mask 180 (S172) is produced on the basis of source wavelength (for example, 248 nm), number of aperture of source (NA: for example 0.7), source filter (for example, out: 0.7/in: 0.5) and using test pattern data 170 (S171). Light is applied to the wafer by means of a wafer aligner (S173) and measurement of the dimensions of the patterns formed on wafer is made (S174).

Figure 12:
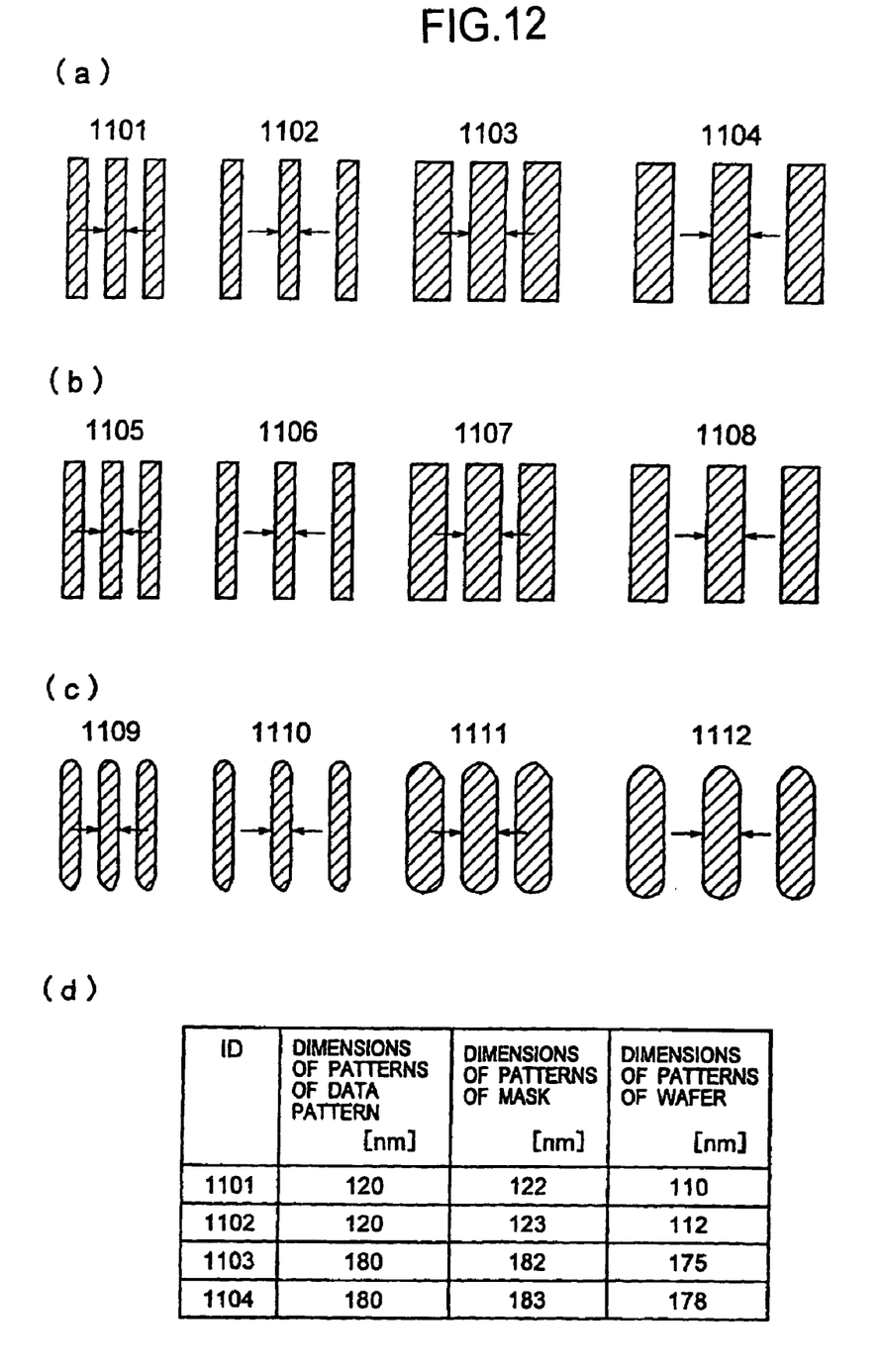
FIG. 12 is an explanatory drawing of a simulation model.

Examples of part of the test pattern data 170 are illustrated in FIG. 12(a), wherein numerals 1101 to 1104 designate the ID of the test pattern data 170.

There are various test pattern data including line & space provided from a maker of a simulator as the test pattern data shown in FIG. 1.

Test masks (designated by numeral 180 in FIG. 1) are produced on the basis of the test pattern data (designated by numeral 170 in FIG. 1).

FIG. 12(b) shows the shapes of the patterns of photomasks, wherein numerals 1105 to 1108 designate the shapes of the patterns of photomasks corresponding to test pattern data with the ID 1101 to 1104, respectively.

FIG. 12(c) shows the patterns transferred on the wafer through the photomasks, wherein numerals 1109 to 1112 designate patterns transferred on the wafer corresponding to test pattern data with the ID 1101 to 1104.

In this case, a difference between the dimensions of test masks 180 and the dimensions of test pattern data 170 is generated.

When conventional simulation model B 290 (S280) shown in FIG. 10 is produced, the data on the dimensions of a pattern of pattern data, dimensions of a pattern formed on a photomask, and dimensions of a pattern formed on a wafer are made into a table as shown in FIG. 12(d). The data shown in the table shown in FIG. 12(d) are provided as simulation model B 290. On the other hand, as mentioned hereinbefore, simulation model A 190 (S180) used in the present example is comprised of a group of dimension data obtained by transferring patterns on wafer (S173) through test mask 180 (S172) which is photomask 180 for a test produced on the basis of test pattern data 170 (S171) under the respective conditions of the wafer exposure with zero focus, a given value minus defocus and a given value plus defocus, measuring the dimensions of given transferred patterns (S174) and relating dimension data of patterns of test pattern data, patterns on the photomask and patterns on the wafer at the corresponding positions with each other for the respective conditions of the exposure to the wafer. A table as shown in FIG. 2 is provided as a simulation model.

Generally, if tables as shown in FIG. 2 and FIG. 12(d) are set up, a simulator model used as a reference by a simulator can be automatically generated by an additional function of a simulator.

In this case, tables shown in FIG. 2 and FIG. 12(d) are also called a simulation model.

The accuracy of the production of a photomask is recorded in the specification 120 of the photomask, as +/− 20 nm against dimensions of design, for example.

The photomask is produced and evaluated on the basis of the accuracy of the dimensions of production, wherein the actual dimensions of the photomask can be changed within the accuracy of the dimensions of production.

Accordingly, generally, in the case of the accuracy of the dimensions of production being +/− 20 nm, oversize data 130 is formed by making oversize pattern data 110 of the object of the process by 20 nm by oversize processing 131 and undersize data 140 is formed by making undersize pattern data 110 of the object of the process by 20 nm by undersize processing 141.

Then, the wafer exposure simulation of pattern data 110 of the object of the process, oversize data 130 and undersize data 140 are carried out (S150) using the wafer exposure simulator (designated by numeral 10 in FIG. 11).

When simulation is carried out with the pattern data 110 of the object of the process, oversize data 130 and undersize data 140, simulations are carried out using each pattern data with the above-mentioned zero focus data, + defocus data and − defocus data, respectively, Namely, nine simulations of three pattern data by focus data are carried out.

Of course, since there is a case that both sides of plus and minus are not defined on the zero standard as the specification of production of photomask defined on only + side of zero standard or as a range of defocus defined on only − side of a range of defocus of zero standard, generally, simulations amount to four sorts through nine sorts.

Referring to FIG. 3 through FIG. 8, examples of shapes of patterns formed on the wafer obtained by such various wafer exposure simulations are mentioned.

Figure 4:
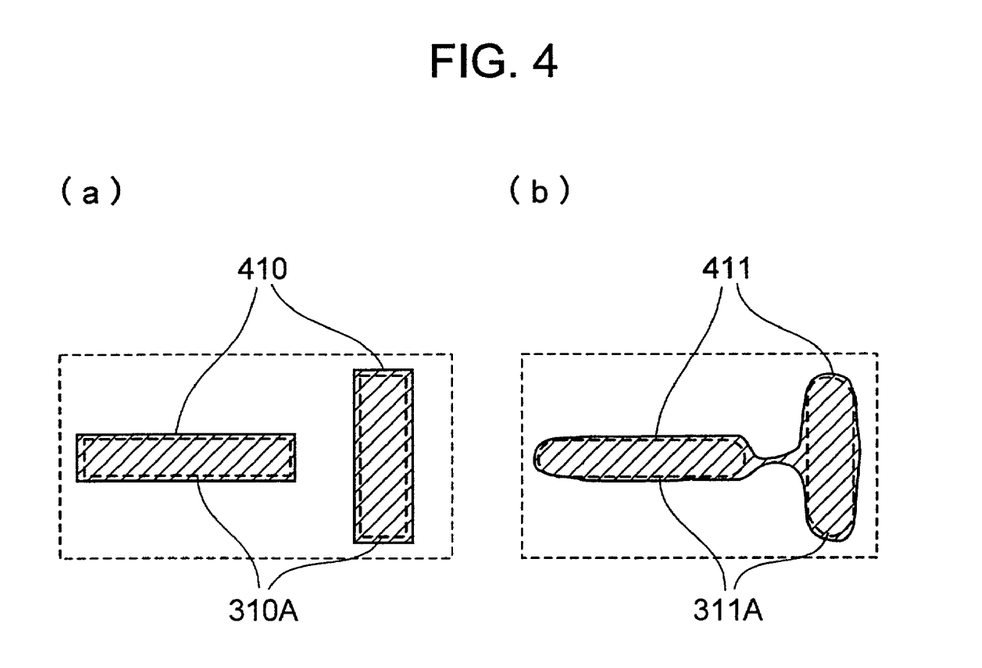
FIG. 4 is an explanatory drawing showing the pattern data used and results of the wafer exposure simulation.
Figure 5:
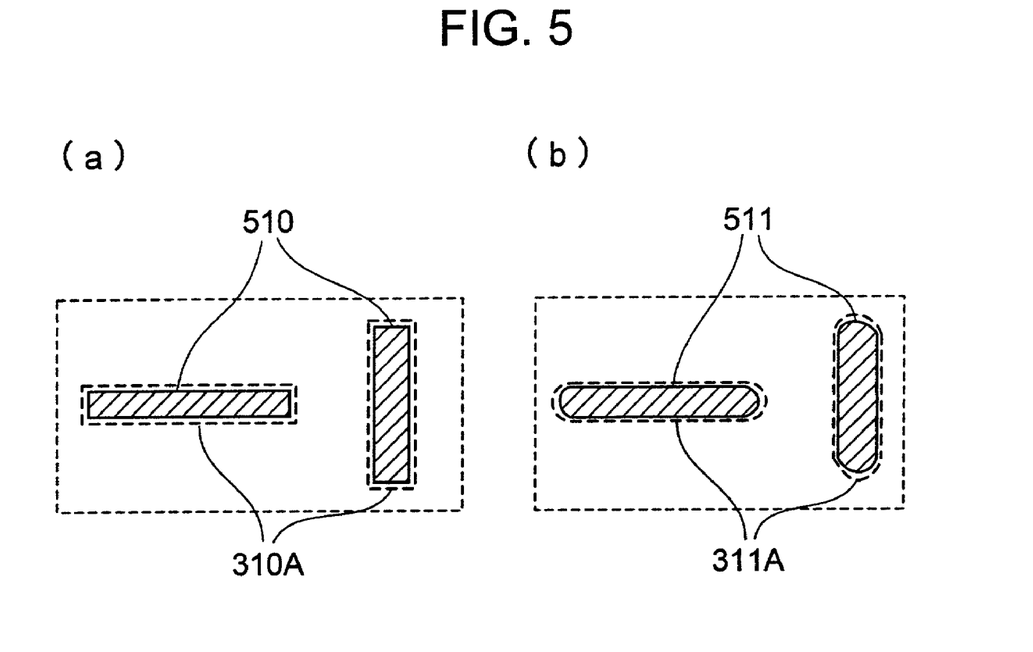
FIG. 5 is an explanatory drawing showing the pattern data used and results of the wafer exposure simulation.
Figure 6:
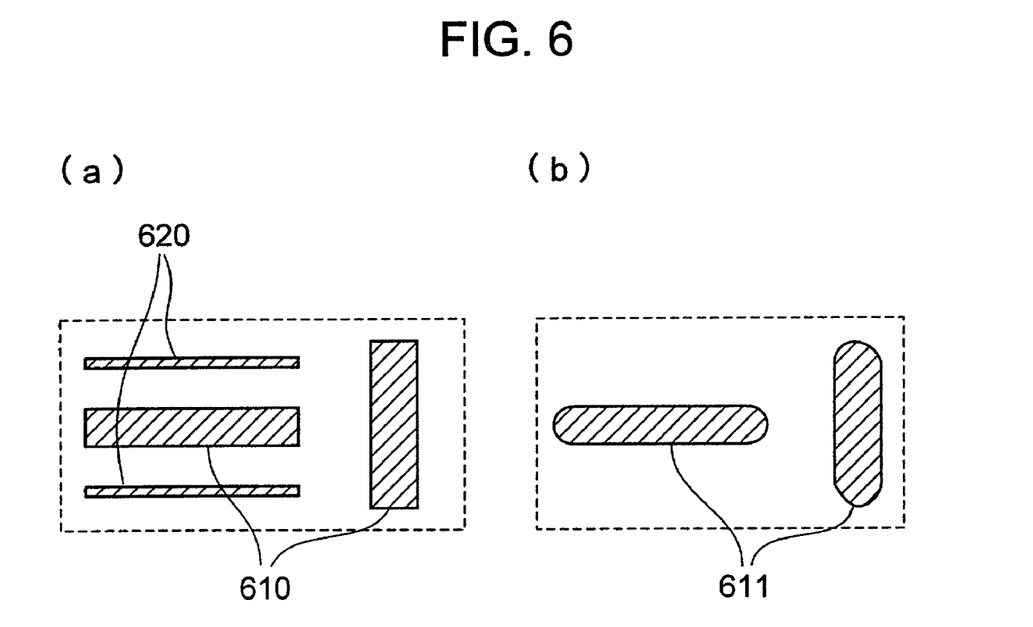
FIG. 6 is an explanatory drawing showing the pattern data used and results of the wafer exposure simulation.
Figure 7:
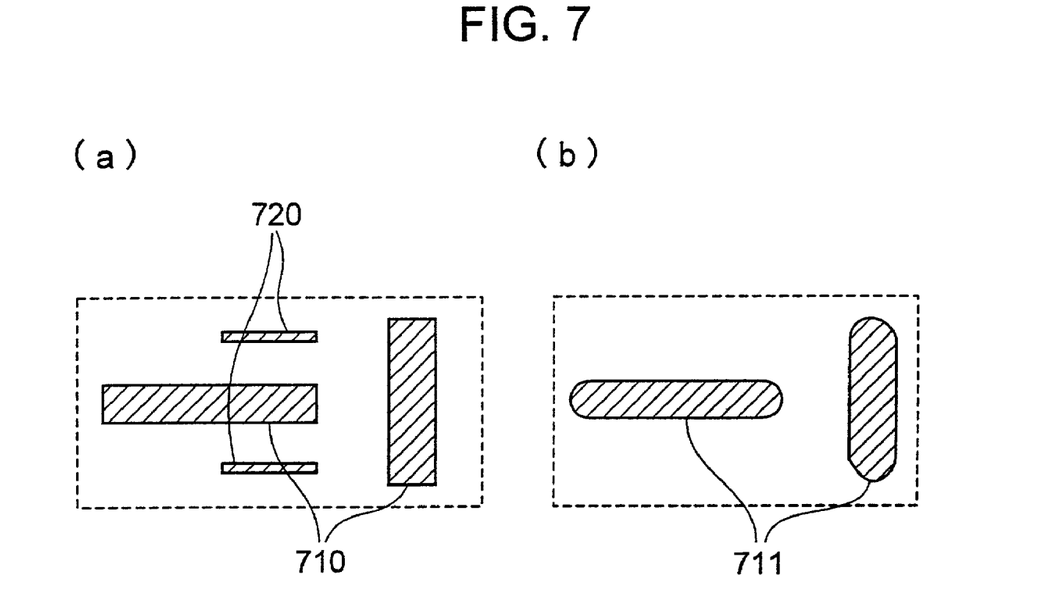
FIG. 7 is an explanatory drawing showing the pattern data used and results of the wafer exposure simulation.
Figure 8:
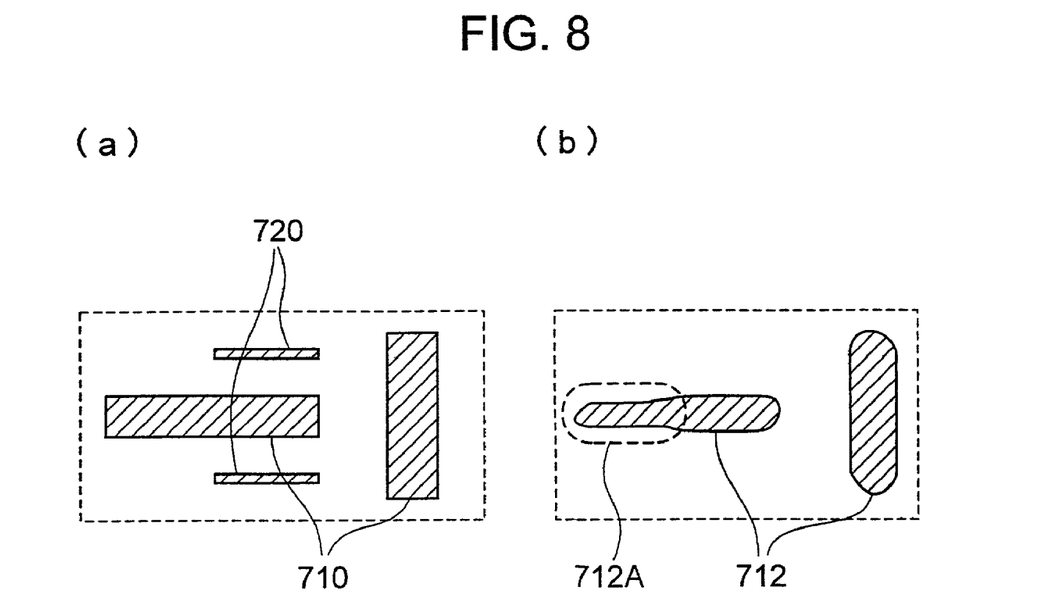
FIG. 8 is an explanatory drawing showing the pattern data used and results of the wafer exposure simulation.

FIG. 3(*a*), FIG. 4(*a*), FIG. 5(*a*), FIG. 6(*a*), FIG. 7(*a*) and FIG. 8(*a*) show pattern data, respectively. FIG. 3(*b*), FIG. 4(*b*), FIG. 5(*b*), FIG. 6(*b*), FIG. 7(*b*) and FIG. 8(*b*) show shape patterns obtained by the wafer exposure simulation in case of pattern data shown in FIG. 3(*a*), FIG. 4(*a*), FIG. 5(*a*), FIG. 6(*a*), FIG. 7(*a*) and FIG. 8(*a*), respectively.

FIGS. 3 thorough 7 show a case that patterns are transferred on a wafer in zero focus. FIG. 8 shows a case that patterns are transferred on a wafer in defocus.

FIG. 3 shows the simulation of a general optical proximity effect.

Rounded patterns 311 shown in FIG. 3(*b*) are obtained to approximate patterns 310 of the object of process.

FIG. 4 shows an example of simulating the influence of errors in the production of a photomask on the plus side in the specification of the production of the photomask, wherein FIG. 4(*a*) shows patterns 410 in which pattern data 310A of the object of the process (area bounded by the dotted line) is oversized as shown by the shadowed portion and FIG. 4(*b*) shows patterns 411 deformed by the influence of the plus errors in the production of the photomask. In FIG. 4(*b*), numeral 311A designates rounded patterns obtained to approximate patterns 310A of the object of the process.

Even if errors in the production of photomask are uniform, the values of deformations depend on whether the patterns are arranged sparsely or densely. Therefore, there are portions in which the values of deformation are remarkably increased and portions in which the values of deformations are kept at small values so that portions with large values of deformation can be detected.

In the same manner, FIG. 5(*a*) shows patterns 511 in which pattern data 310A of the object of the process (area bounded by the dotted line) is undersized as shown by the shadowed portion and FIG. 5(*b*) shows the results of simulating the patterns 510.

In the case of undersize processing, deformations in which adjacent patterns are connected with each other are not generated. However, there is a case that the patterns cannot be resolved.

FIGS. 6 through 8 show a simulation made under the consideration of the defocus latitude.

FIG. 6(*a*) shows a case in that an assist bar OPC is applied to patterns of the object of process wherein pattern 610 of the object of the process and OPC patterns 620 are arranged and FIG. 6(*b*) shows the shapes of patterns 611 formed on a wafer corresponding to patterns 610.

FIG. 7(*a*) shows a case that an assist bar OPC is applied, wherein patterns 710 of the object of the process and the same OPC patterns 720 are arranged in the same manner as patterns shown in FIG. 6(*a*) and a part of the OPC patterns 720 is cut from some reason.

Since OPC patterns 720 are OPC for increasing the defocus latitude, the influence of OPC patterns hardly appears in the state of zero focus. Therefore, shapes of patterns formed on wafer become almost the same in a case shown in FIG. 6(*b*) and a case shown in FIG. 7(*b*).

FIG. 8 shows result of simulation (FIG. 8(*b*)) in which the exposure of data to a wafer is made using data of the object of the process shown in FIG. 7(*a*) and under the condition of defocus. Results of the exposure of data to a wafer shown in FIG. 8(*b*) differs from the results of the simulation shown in FIG. 7(*b*), wherein thinned part 712A is generated at a portion corresponding to the cut of OPC pattern 720 in patterns 712 on patterns 712 on the wafer corresponding to patterns 710 of pattern data of the object of the process.

The cut of a part of an OPC pattern can be detected by detecting the thinned part 712A.

In such a way, according to the present simulation, the shapes of patterns formed on a wafer can be obtained under various conditions and a portion of a bad condition can be detected for data of the object of the process from shapes of the obtained patterns on a wafer.

The results can be fed back for reformation or correction of the pattern data of the object of the process. Accordingly, a method of evaluating the exposure of data to a wafer in which deformation of patterns caused by errors in the production of a photomask and defocus in the exposure of data to the wafer becomes possible.

Namely, it is possible to evaluate the errors in the production of a photomask and deformation caused by defocus in the exposure of data to a wafer in the stage of pattern data.

As mentioned hereinbefore, the present invention enables the production of a method of evaluating the exposure of data to a wafer in which errors in the production of a photomask and deformation of patterns caused by defocus in the exposure of data to a wafer are considered. According to the present invention, it is made possible to evaluate the errors in the production of a photomask and deformation caused by defocus in the exposure of data to the wafer in the stage of design data.

Particularly, according to the present invention, it is made possible to deal with high density circuits and the miniaturization of semiconductor devices.

What is claimed is:

1. A method of evaluating the exposure property of data to a wafer in which pattern data for the production of a photomask, including design data designed for a circuit of a semiconductor device and data in which OPC is applied to design data, are used as pattern data for an object of a process and the exposure property of data to a wafer in case of the production of a photomask of the object of the process is evaluated in a data stage, without producing the photomask from pattern data for the object of the process, wherein the method comprises the steps: performing oversize processing and undersize processing to pattern data of the object of the process by figure operation for all pattern data within a range of errors of the production in the specification of the production of a photomask; carrying out wafer exposure simulation using a simulation model provided in advance as a reference for original pattern data of the object of the process, oversize data in which oversize processing is given to the pattern data and undersize data in which undersize processing is given to the pattern data under conditions of a wafer exposure of a zero defocus or under the respective conditions of a wafer exposure of a zero defocus, a given value minus defocus and a given value plus defocus and; evaluating the exposure property of the data for the wafer from the results of the wafer exposure simulation, and wherein the simulation model is comprised of a group of dimension data obtained by using a test photomask for a test produced on the basis of test pattern data, carrying out the exposure of data to the wafer under conditions of a zero defocus, or under respective conditions of a zero defocus, a given value minus defocus and a given value plus defocus, measuring dimensions of the patterns transferred to the wafer and by relating dimension data on the test pattern data, dimension data on the photomask and dimension data on patterns on the wafer at the corresponding positions with each other for the respective conditions of the wafer exposure.

2. A method of evaluating the exposure property of data to a wafer in which pattern data for the production of photomask, including design data designed to the circuit of semiconductor device and data in which OPC is applied to design data, are used as pattern data for an object of a process and the exposure property of data to a wafer in case of the production of a photomask of the object of the process is evaluated in a data stage, without producing a photomask from pattern data of the object of the process, wherein the method comprises the steps of: carrying out the exposure of data to a wafer using a simulation model provided in advance as a reference for pattern data of the object of a process under the respective conditions of a zero defocus, a given value minus defocus and a given value plus defocus and; evaluating an exposure property of data to the wafer from the results of the wafer, and wherein the simulation model is comprised of a group of dimension data obtained by using a test photomask for a test produced on the basis of test pattern data, carrying out the exposure of data to the wafer under the respective conditions of a wafer exposure of a zero defocus, a given value minus defocus and a given value plus defocus, measuring dimensions of the patterns transferred to the wafer and relating dimension data of the test pattern data, dimension data of patterns on the photomask and dimension data on the wafer at corresponding portions for the respective conditions of the wafer exposure.

3. A method of evaluating the exposure property of data to a wafer as claimed in claim 1, wherein pattern data of the object of the process is pattern data in which OPC is applied to design data.

4. A method of evaluating the exposure property of data to a wafer as claimed in claim 2, wherein pattern data of the object of the process is pattern data in which OPC is applied to design data.

* * * * *